United States Patent [19]

Nomura et al.

[11] Patent Number: 4,771,180
[45] Date of Patent: Sep. 13, 1988

[54] EXPOSURE APPARATUS INCLUDING AN OPTICAL SYSTEM FOR ALIGNING A RETICLE AND A WAFER

[75] Inventors: Noboru Nomura, Kyoto; Kazuhiro Yamashita, Amgasaki, both of Japan

[73] Assignee: Matsushita Electric Industrial Co. Ltd., Tokyo, Japan

[21] Appl. No.: 916,738

[22] Filed: Oct. 8, 1986

[30] Foreign Application Priority Data

| Oct. 11, 1985 | [JP] | Japan | 60-227103 |
| Nov. 28, 1985 | [JP] | Japan | 60-267869 |
| Jan. 17, 1986 | [JP] | Japan | 61-8229 |
| Apr. 30, 1986 | [JP] | Japan | 61-99644 |
| Apr. 30, 1986 | [JP] | Japan | 61-99645 |

[51] Int. Cl.$^4$ .......................................... G01N 21/86
[52] U.S. Cl. ..................................... 250/548; 356/400
[58] Field of Search ........................... 250/548, 557; 356/399–401

[56] References Cited

U.S. PATENT DOCUMENTS

| 3,796,497 | 3/1974 | Mathisen et al. |
| 3,885,877 | 5/1975 | Horwath et al. |
| 4,202,627 | 5/1980 | Suzki et al. |
| 4,251,129 | 2/1981 | Suzki et al. |
| 4,423,959 | 1/1984 | Nakazawa et al. |
| 4,566,795 | 1/1986 | Mastuura et al. ................. 356/401 |
| 4,636,077 | 1/1987 | Nomura et al. |
| 4,636,626 | 1/1987 | Hazama et al. |
| 4,668,089 | 5/1987 | Oshida et al. ..................... 250/548 |

FOREIGN PATENT DOCUMENTS

| 2651430 | 12/1977 | Fed. Rep. of Germany ...... 356/399 |
| 2825501 | 11/1979 | Fed. Rep. of Germany . |

*Primary Examiner*—Edward P. Westin
*Assistant Examiner*—Khaled Shami
*Attorney, Agent, or Firm*—Wenderoth, Lind & Ponack

[57] ABSTRACT

A reduction projection type alignment and exposure apparatus having a light source, for alignment, a reticle having at least a first grating, first lens system, a spatial filter disposed around a Fourier spectral plane of the first lens system, second lens system, a wafer having at least a second grating, and a photo-detector for detecting light intensity of superimposed beams appearing on the spatial filter. An optical system for light exposure is provided separately from the optical system for alignment which includes the light source for alignment, first and second lens system, spatial filter, etc. The light beam generated from the light source for alignment is applied to the reticle at which it is divided into a plurality of difracted light beams by the first grating, and the diffracted light beams are applied through the first lens system, spatial filter and second lens system onto the wafer so that the diffracted light beams are re-diffracted by the second grating, and the re-diffracted light beams are superimposed with the diffracted light beams and the light intensity of the superimposed beams detected by the photo-detector.

6 Claims, 21 Drawing Sheets

$p_1 \sin \theta_1 = \lambda \qquad \zeta_{64} = f_1 \sin \theta_1$

Displacement

EXPOSURE APPARATUS INCLUDING AN OPTICAL SYSTEM FOR ALIGNING A RETICLE AND A WAFER

BACKGROUND OF THE INVENTION

This invention relates to an exposure apparatus which is capable of realizing a line width of submicron order and high precision alignment of a reticle and a wafer.

The rate of integration in semiconductor devices has increased more and more recently, and therefore, dimensions of semiconductor devices are approaching submicron order. In forming minute patterns of such submicron order, conventional exposure by use of ultra violet rays can not form such minute patterns. As exposure apparatus which may realize the formation of such minute patterns, exposure apparatus which use deep ultra violet rays, X rays, an electron beam, an ion beam, etc. have been studied and highlighted. However, such exposure apparatus are expensive and, in exposure apparatus which use X rays, an electron beam, or an ion beam, beam strength is weak and exposure takes a long time so that it is difficult to apply such exposure apparatus to mass-production of semiconductor devices.

In an exposure apparatus which is applied to mass-production of semiconductor devices, a reduction projection alignment and exposure apparatus, i.e., a reduction projection aligner, is used. The exposure apparatus of this type comprises a light source, a condenser lens, a reticle and a reduction micro-lens. Light beams from a light source are applied to the reduction microlens through the condenser lens and the reticle. An image of the reticle pattern is focused on wafer by the reduction microlens. In the case of the above-stated reduction projection exposure, a numerical aperture N.A. can be set to a large number, and, supposing that the N.A. is 0.32, the reduction rate m is 10 and the wavelength $\lambda$ of the light beam is 435.6 mm, with the highest resolution (minimum feature size) being approximately 0.9 $\mu$m in line width.

In realizing semiconductor devices with a submicron order line width, alignment of a photo-mask and a wafer is important. In the past, several alignment methods have been used or proposed. One such method is the mark alignment method wherein an alignment mark is disposed on the photo-mask and in the wafer, respectively. The alignment is carried out by aligning the above-stated two alignment marks. This method results in low alignment precision 0.2 $\mu$m/3$\sigma$, and therefore, can not be applied to production of submicron devices.

Another method is the superimposed dual grating interferometric alignment method which was proposed by S. Austin (see, Applied Physics Letters, Vol. 31, No. 7, p. 428, 1977). This method uses interference of light rays and can realize a higher precision alignment of the photo-mask and the wafer, but the constructed interferometers were not ideal so that the alignment was affected by the gap between the mask and the wafer. As a result, it is difficult to make a commercially usable apparatus.

Still another method is the alignment method by observing secondary electron emission emitted from semiconductor devices. However, this method can not be used in air so that output in manufacturing LSIs is small.

Incidentally, the basic structure of the present invention is disclosed in copending, commonly assigned patent application Ser. No. 761,024 filed on July 31, 1985.

SUMMARY OF THE INVENTION

It is, accordingly, a primary object of this invention to provide an exposure apparatus which is capable of eliminating the above-stated drawbacks of conventional apparatus.

Another object of this invention is to provide an exposure apparatus which is capable of realizing a line width of submicron order at low cost with a simple structure.

A further object of this invention is to provide an exposure apparatus which is capable of realizing precise alignment of minute patterns in air with a simple structure.

A still further object of this invention is to provide an exposure apparatus which has a compensation function whereby the position of the gratings for alignment is compensated based upon detection of non-symmetry when the gratings are located non-symmetrically on the wafer.

These and other objects are accomplished by an exposure apparatus which comprises a light source, a reticle having a first grating, a first lens system, a second lens system, a spatial filter disposed between the first and second lens systems, a reduction projection lens, a wafer having a second grating, and a photo-detector. Thereby, the light beam generated from the light source is applied to the reticle at which it is divided into a plurality of diffracted light beams by the first grating, and the diffracted light beams are applied through the first lens system to the spatial filter so that only predetermined diffracted light beams pass through the spatial filter, and the selected diffracted light beams are applied through the second lens system and the reduction projection lens to the wafer so that the selected diffracted light beams are re-diffracted by the second grating, and the re-diffracted light beams are interfered with each other, and light intensity of the interfered light beams is detected by the photo-detector, and alignment of the reticle and the wafer is conducted based upon the output of the photo-detector.

In a specific embodiment, a third lens system for converting reversed interference fringes to a normal image may be further provided.

This invention provides various advantages, among which are as follows.

(1) It makes it possible to provide an exposure apparatus which may realize line width of a submicron order at low cost with a simple structure.

(2) It makes it possible to provide an exposure apparatus which may realize precise alignment of a minute pattern in air with a simple structure.

While the novel features of the invention are set forth with particularity in the appended claims, the invention, both as to its organization and content, will be better understood and appreciated, along with other objects and features thereof, from the following detailed description taken in conjunction with the drawings.

DETAILED DESCRIPTION OF THE INVENTION

Figure 1:
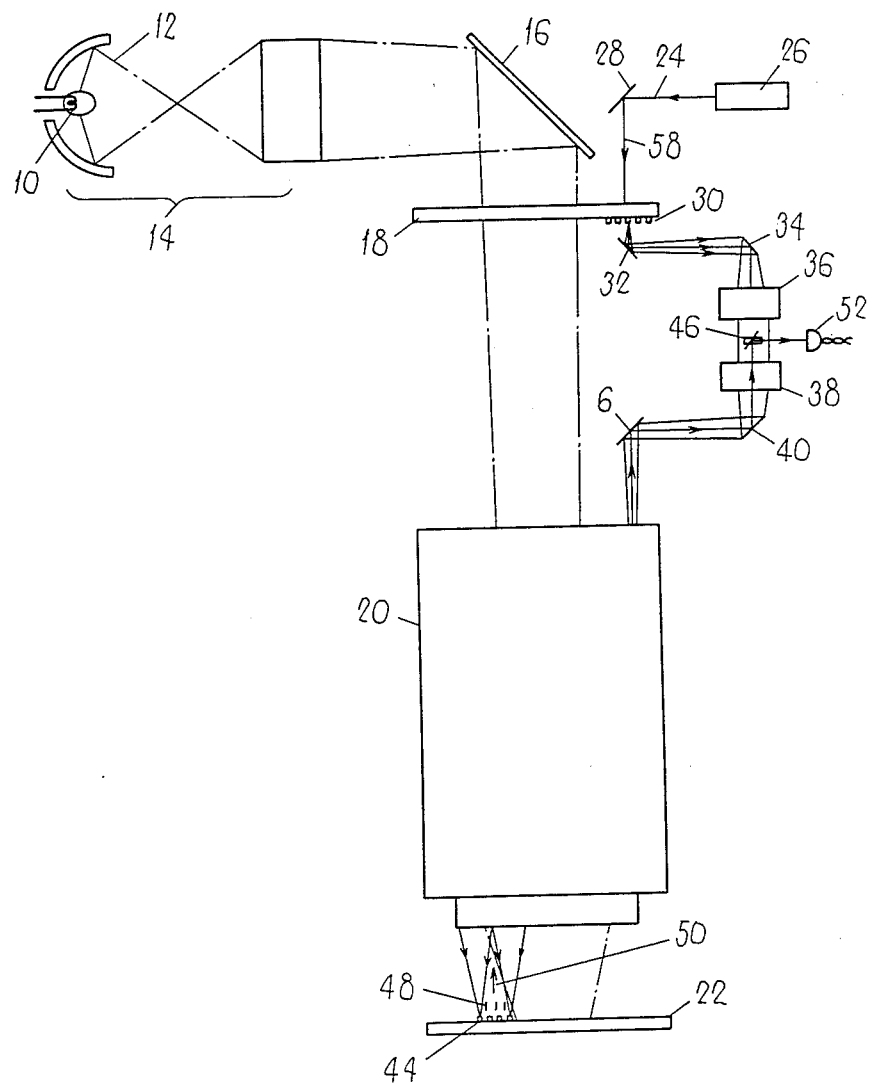
FIG. 1 shows a schematic structure of an exposure apparatus of a first embodiment of the invention.

FIG. 1 shows a schematic representation of a structure of a reduction projection type alignment and exposure apparatus, i.e., reduction projection aligner, as an embodiment of this invention. In the apparatus, there are two kinds of optical systems. One is a first optical system for pattern exposure. The other is a second optical system for alignment. The first optical system is explained first. A light source 10 generates a light ray 12 therefrom. The light ray 12 passes through an illumination optical system 14 and then, is applied to a mirror 16. The light ray reflected by the mirror 16 passes through a reticle 18 and a reduction projection optical system 20. The light ray from the reduction projection optical system 20 is focused on a semiconductor wafer 22.

The second optical system is now explained. A light beam 24 emitted from a light source 26 is reflected by a mirror 28 and then, passes through the reticle 18, in particular, through a portion of a first grating 30. The light beam from the grating 30 is reflected by mirrors 32, 34 and then, passes through first and second lens systems 36, 38. These lens systems are formed by Fourier lenses but are not limited to such Fourier lenses. The light beam emitted from the second lens system 38 is reflected by mirrors 40, 42 and then, passes through the reduction projection optical system 20. The light beam emitted from the reduction projection optical system 20 is applied to the wafer 22, in particular, to a second grating 44 which is formed on the wafer 22. In this alignment optical system, refracted light (Fourier spectrum) of the first grating 30 is spatially distributed on a rear focal plane of the first lens system 36 (Fourier transformation lens, in this embodiment). On the Fourier transformation plane, a spatial filter 46 is disposed for filtering. By filtering the pattern from the first grating 30 on the spectral plane, interference fringes 48 are produced on the wafer 22. Re-diffracted light 50 is emitted from the second grating 44 and passes through the reduction projection optical system 20, and is reflected by mirrors 42 and 40 and further, passes through the second lens system 38. Then, the rediffracted light from the second lens system 38 is reflected by a mirror which is disposed at the position of the spatial filter 46, and then, applied to an optical detector 52.

As apparent from the above-stated explanation of FIG. 1, the optical system for alignment of the wafer and reticle is mainly disposed outside of the optical system for light exposure.

Figure 2:
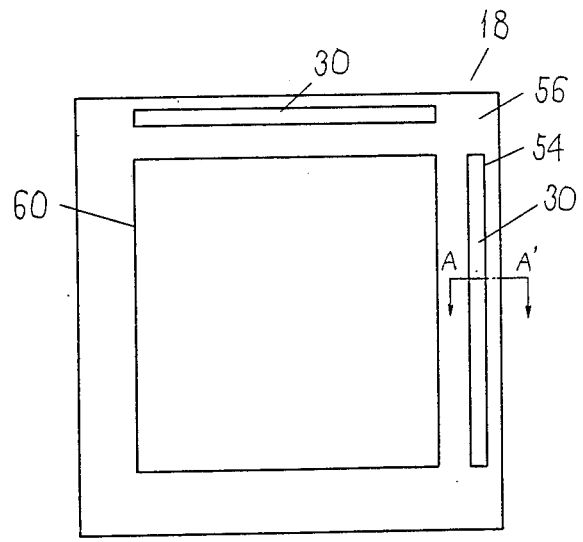
FIG. 2 is a plan view of a reticle.
Figure 3:
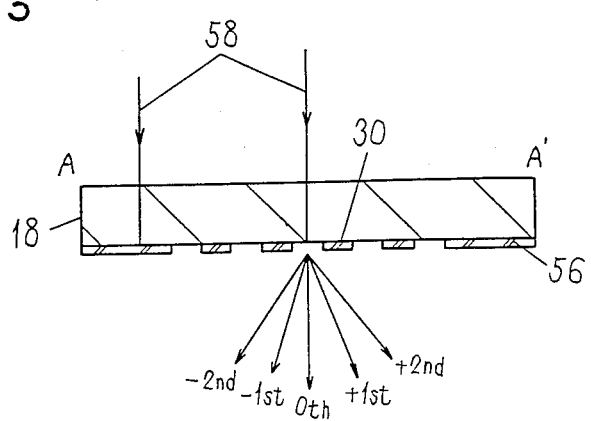
FIG. 3 is a sectional view taken along the line A—A' of FIG. 2.

FIG. 2 is a plan view of the reticle 18. The reticle 18 comprises a window portion 54 through which light passes, and interception portion 56 which intercepts light. The grating 30 can be an amplitude grating formed in the window 54 as shown in FIG. 3. The pattern of the window portion 54 is minuted in the direction of the grating. A plurality of diffracted light rays such as O order, ±1st order, ±2nd order ... are diffracted by the grating 30. The intercetion portion 56 surrounding the window portion 54 is formed by a film of chromium, chromium oxide, etc. Incident light 58 passes only through the window portion 54. The amplitude grating 30 may be replaced by a phase grating, and also by an echelet grating in the case where the incident light is applied obliquely. In FIG. 2, a circuit pattern is shown by numeral 60.

Figure 4:
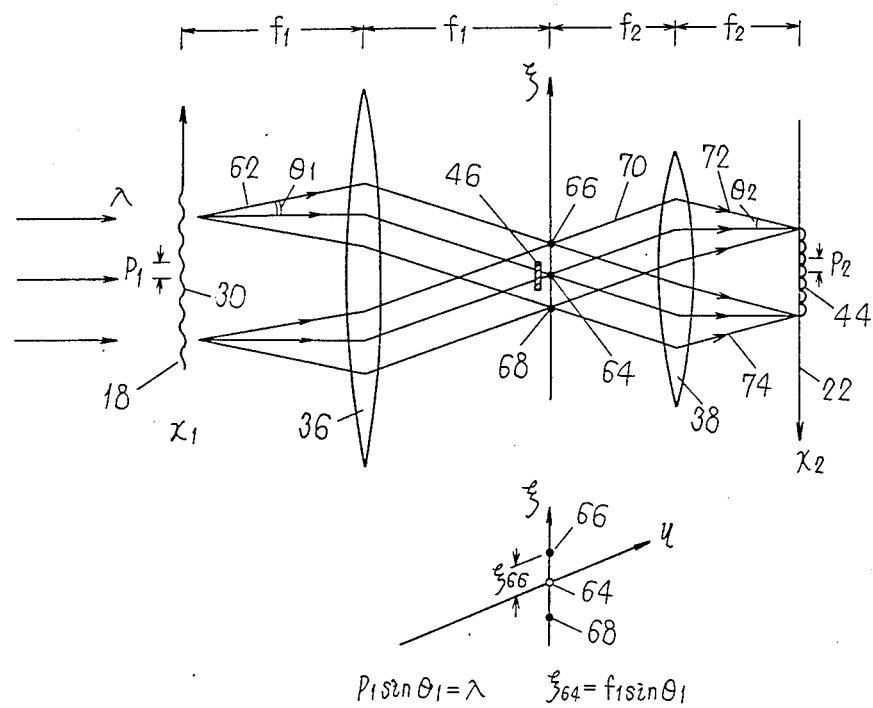
FIGS. 4 and 5 are illustrations explaining the principle of operation of the exposure apparatus of FIG. 1.

FIG. 4 is an illustration for explaining the principle of operation of the exposure apparatus of the first embodiment. As stated above, the light of wavelength λ from the light source 10 is incident upon the reticle. The grating 30 of reticle 18 is located at position $X_1$ which corresponds to a front focal distance $f_1$ of the first Fourier transformation lens 36. The pitch $P_1$ of the grating 30 and a diffraction angle $\theta_1$ of a diffracted light beam 62 have the following relationship.

$$P_1 \sin \theta_1 = \lambda \tag{1}$$

The diffracted light beam 62 is applied to the first Fourier transformation lens 36 and then, Fourier spectral images 64, 66, and 68 are formed on a rear focal plane ξ.

The co-ordinates $\xi_{66}$ on which the Fourier spectral image 66 of a first order diffracted light is formed is shown by the following equation.

$$\xi_{66} = f_1 \sin \theta_1 \tag{2}$$

The co-ordinates $\xi_{64}$ on which the Fourier spectral image 64 of a 0th order diffracted light is formed is shown by the following equation.

$$\xi_{64} = f_1 \sin \theta_0 = 0 \tag{3}$$

Therefore, the Fourier spectral image 66 is formed completely separately from the Fourier spectral image 64. As shown in FIGS. 1 and 4, the spatial filter 46 is disposed on the Fourier transformation plane and prevents the passage of 0th order diffracted light; i.e., only ±1st order diffracted light is passed through the spatial filter 46. A diffracted light beam 70 passed through the spatial filter 46 then, passes through the second Fourier transformation lens 38, and is projected on the wafer 22. The image formed on the wafer 22 includes an image corresponding to the reticle pattern and the fringe formed by interference of two light beams. The fringe has a pitch $P_2$ which is shown as follows.

$$P_2 = \frac{\lambda}{2 \sin \theta_2} \quad (4)$$

wherein, $\theta_2$ is the diffraction angle of light which passed through the second Fourier transformation lens 38.

Since the Fourier transformation plane of the first Fourier transformation lens 36 is located on a front focal distance $f_2$ of the second Fourier transformation lens 38, the following relationship is established.

$$f_1 \sin \theta_1 = f_2 \sin \theta_2 = \xi_{66} \quad (5)$$

The images passes through the first and second Fourier transformation lenses have the following relationship.

$$P_2 = \frac{\lambda}{2 \sin \theta_2} = \frac{f_2 \lambda}{2 f_1 \sin \theta_1} = \frac{f_2}{f_1} \cdot \frac{P_1}{2} \quad (6)$$

As apparent from equation (6), the pitch $P_2$ of the fringe which is formed on the wafer 22 becomes half of the pitch $P_1$ of the grating which is formed on the reticle 18 when $f_1$ is set to be equal to $f_2$.

Figure 5:
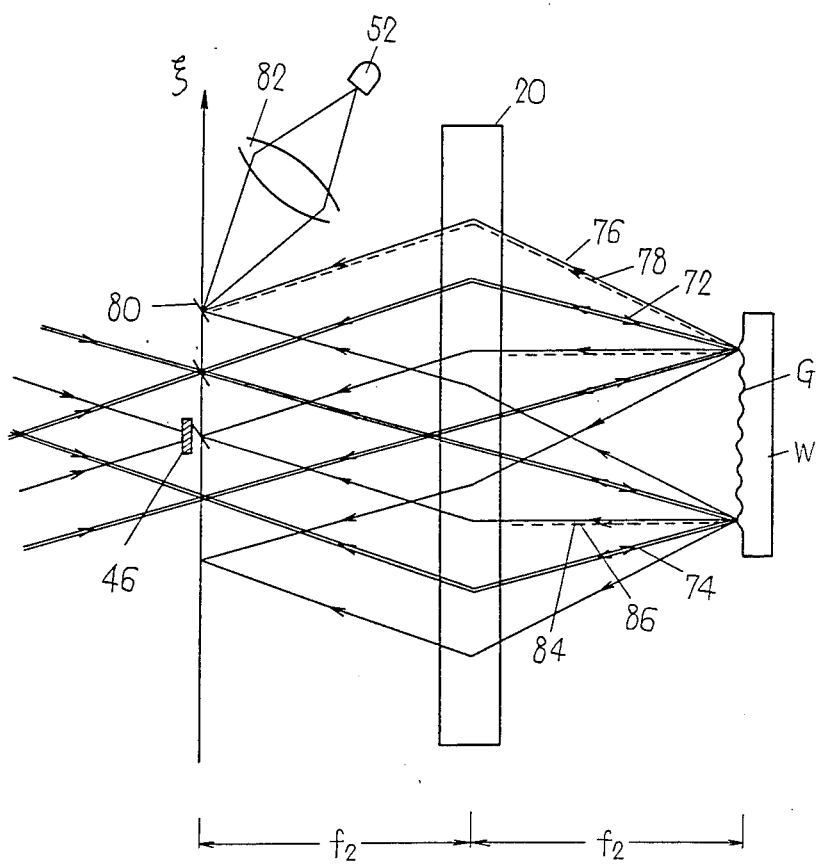

A grating having a pitch which is a multiple of an integer times the fringe pitch will re-diffract conjugate incident beams 72, 74 in the same direction 76, 78 as shown in FIG. 5. If these two re-diffracted light beams 76 and 78 are superimposed so that they are interfered with each other, light intensity information is obtained which indicates the relation between the fringe and the grating. The light 76 is reflected by a mirror 80 and then, applied through a lens 82 to a photo-detector 52. Optical intensity I which is observed on the photo-detector is shown as follows.

$$I = U_A^2 + U_B^2 + U_A^* \cdot U_B + U_A \cdot U_B^* \quad (7)$$

wherein, $U_A$, $U_B$ represent the amplitudes of light beams 84, 86, respectively, and $U_A^*$, $U_B^*$ represent the conjugate complex amplitudes thereof.

$$U_A^2 = A^2 \left( \frac{\sin N \frac{\delta A}{2}}{\sin \frac{\delta A}{2}} \right)^2 \quad (8)$$

$$U_B^2 = B^2 \left( \frac{\sin N \frac{\delta B}{2}}{\sin \frac{\delta B}{2}} \right)^2 \quad (9)$$

$$U_A^* \cdot U_B + U_A \cdot U_B^* = \quad (10)$$

$$2 \cdot A \cdot B \cos \left| (N-1) \frac{\delta A - \delta B}{2} + KX(\sin \theta_A - \sin \theta_B) \right| \times$$

$$\frac{\sin N \frac{\delta A}{2} \cdot \sin N \frac{\delta B}{2}}{\sin \frac{\delta A}{2} \cdot \sin \frac{\delta B}{2}}$$

Figure 6:
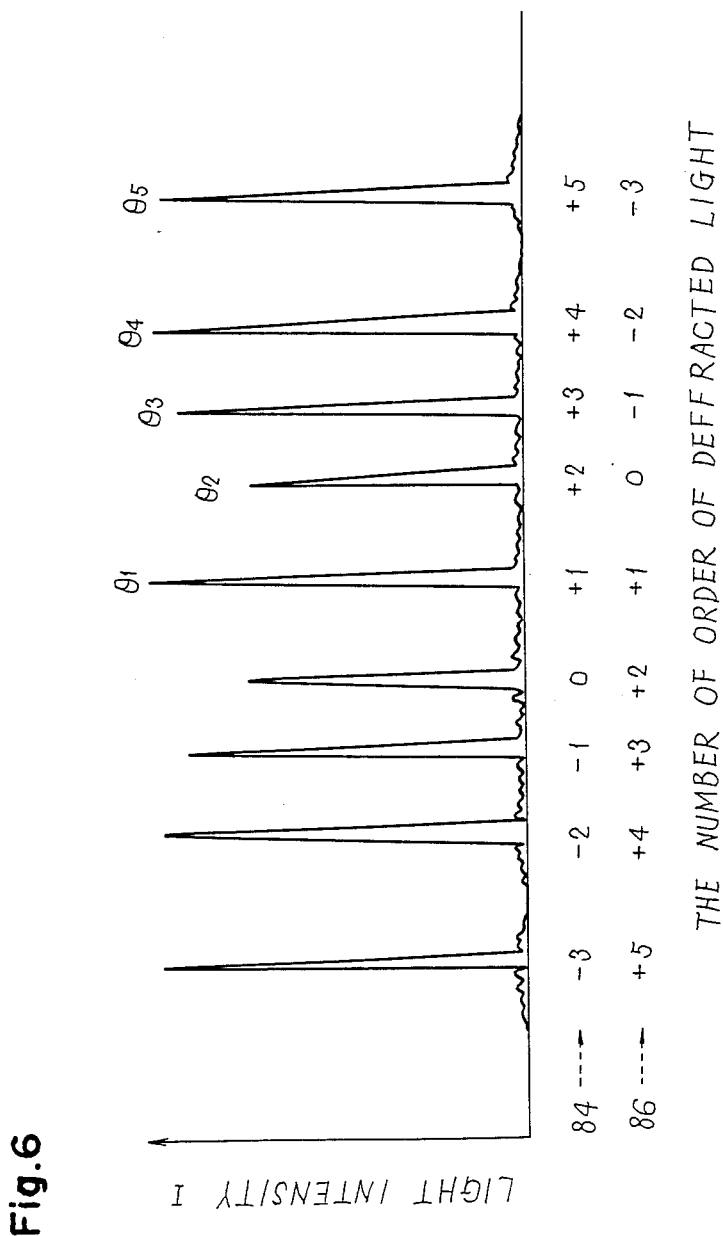
FIG. 6 shows a graph of light intensity vs. observing angle.

Wherein, A, B: constant, N: the number of the grating, $\delta A$, $\delta B$: phase retardation between diffracted light beams diffracted by two adjacent gratings, X: relative position between the fringe formed by light beams 84, 86, and the grating, $\delta A$, $\delta B$: angle formed by light beams 84, 86 and a line perpendicular to wafer 22. FIG. 6 shows a graph of light intensity I vs. Observing angle characteristic with the condition that the pitch of the fringe is 1 $\mu m$ and the pitch of the grating is 2 $\mu m$. Sharp peaks of light intensity appear only when the pitch of the grating is an integer times the pitch of the fringe. In FIG. 6, the observing angle varies from $-\pi/2$ through $\pi/2$ and five peaks appear at $\theta_1$, $\theta_2$, $\theta_3$, $\theta_4$ and $\theta_5$ in the positive angle range. At the peak of $\theta_2$, 0-th order diffracted light of incident beams 84, 86 are diffracted. The peak of $\theta_4$ corresponds to a peak of 1st order diffracted light generated when the pitch of the fringe equals the pitch of the grating. The peaks of $\theta_1$–$\theta_5$ include position information between the fringe and the grating G on wafer 22.

Each light intensity of the peaks is observed as superimposed diffracted light beam pairs such as $(-3, +5)$, $(-2, +4), \ldots (+5, -3)$.

As to the exposure apparatus of the first embodiment, the operation is now explained with reference to FIGS. 1 through 6. In FIG. 1, reticle 18 is first inserted into the light path and then, the wafer 22 is disposed on the apparatus. Rough alignment of the reticle 18 and the wafer 22 is conducted and then, the first grating 30 of the reticle 18 is illuminated by a light beam 58 from the light source 26 (laser device, in this case). As a result, a plurality of diffracted light rays are emitted from the first grating 30 as shown in FIG. 3 and applied to the first lens system 36. The spatial filter 46 is disposed in such a manner that only +1st order light beams selectively pass therethrough. The +1st order light beams passed through spatial filter 46 pass through the second lens system 38 and the reduction projection optical system 20, and are applied to the wafer 22 so that interference fringes are generated near the wafer 22.

In the case where the wavelength of light source 26 is different from that of light source 10 for projection, the ratio of the focal distances $f_1$ and $f_2$ of the first and second lens systems is varied in such a manner that the pitch of the second grating 44 becomes an integral multiple of that of the interference fringes. In the case where the light source 10 for projection is a pulsating one, such as an Eximer laser, a laser of continuous oscillation, a halogen lamp, etc. can be used as the light source 26 for alignment. Further, in the case where an Eximer laser, etc. is used, the wavelength is limited but matching of the two light sources 10 and 26 is possible. In the case where sensitivity of the photo-resist on the wafer 22 is limited to a certain wavelength, the wavelength of the alignment light source 26 can be selected to be one at which there is no sensitivity of the photo-resist so that alignment marks can be protected.

The re-diffracted light from the second grating 44 is detected by the photo-detector 52 and high precision alignment of the wafer 22 and reticle 18 is possible based on the principle stated above. After the alignment is completed, the reticle pattern is projected on the wafer 22 by use of the light source 10 and the reduction projection optical system 20.

In the foregoing, if the spatial filter is disposed in the reduction projection optical system, the spatial filter and some mirrors should be inserted into and removed from the system since the spatial filter, etc. interfere with exposure light during a projection exposure period. The insertion and removal of the spatial filter causes a problem due to vibration upon insertion and removal thereof. Thereby, the relative position of the lens system and wafer versus the reticle is changed. Further, as to mirrors relating to the spatial filter, it is difficult to dispose the mirrors at the same position as they were (position deviation of approximately 2 μm will occur) and it is difficult to control the position of the wafer surface. Further, since the filter, mirror, etc. have their inertia, the insertion and removal thereof takes some time so that it takes a longer time for alignment than ever.

In this embodiment, the spatial filter 46 and mirrors 28, 32, 34, 40, 42 are fixed in an alignment optical system. Further, since the alignment optical system is separated from the projection optical system, the insertion and removal of the spatial filter and mirrors are not necessary. The relative position of the spatial filter and mirrors is always the same since these are fixed, so that it is possible to conduct the alignment with high precision and in short time.

Figure 8:
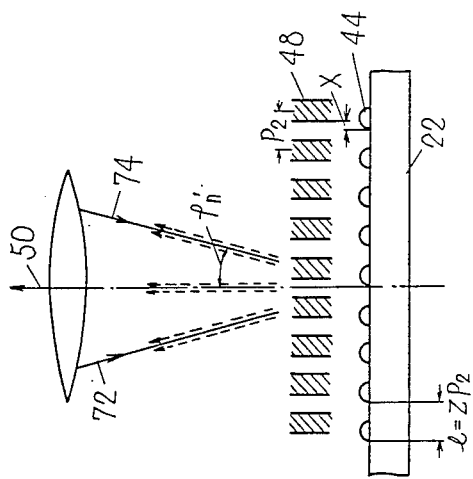
FIG. 8 shows a portion of FIG. 7 within the dotted circle X in an enlarged manner.
Figure 7:
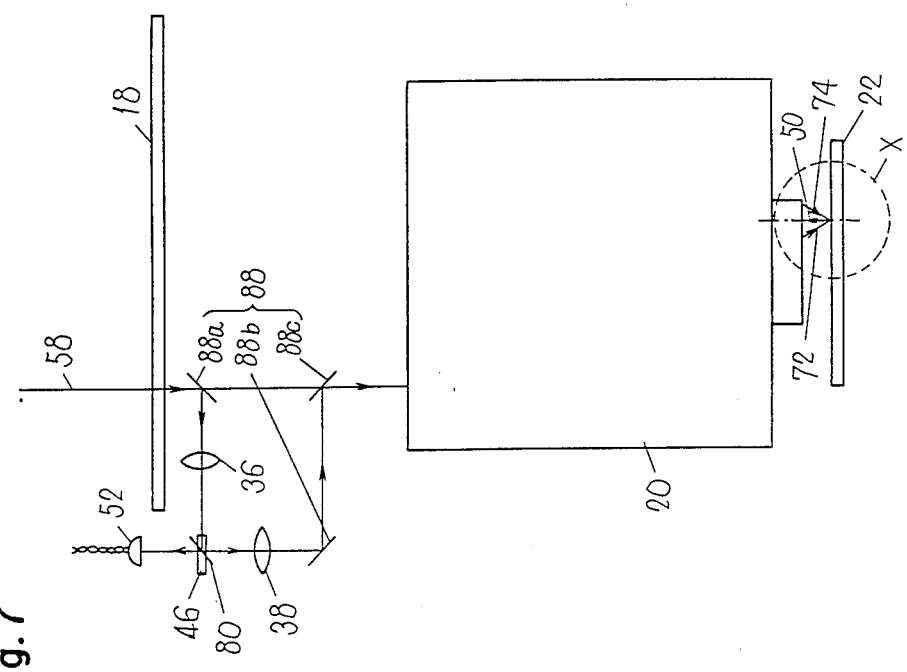
FIG. 7 shows a schematic structure of an exposure apparatus of a second embodiment of the invention.
Figure 9:
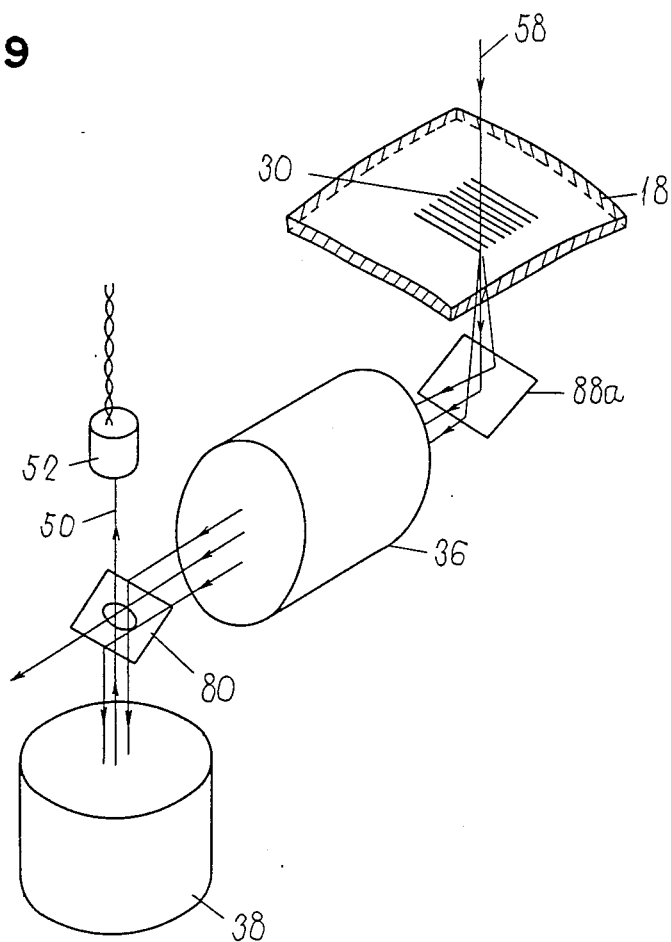
FIG. 9 is a perspective view of a part of the apparatus of FIG. 7.

The apparatus of a second embodiment is now explained with reference to FIGS. 7 through 9. The apparatus is different from that of the first embodiment stated above on the following point. There is provided a conversion optical system 88 which includes reflection mirrors 88a~88c, and 80. The conversion optical system 88 is used for deflecting a light axis four times so that images of gratings, which are formed on the reticle 18 by the first grating 30 and second lens system 38, become conjugated in position.

In the apparatus, the light beam diffracted by the first grating 30 of the reticle 18 is separated into ±n-th spectrums. When all of the n-th spectrums are applied to the second lens system 38, the image of the first grating 30 is formed on the rear focal point of the second lens system 38. The spatial filter 46 is disposed to pass only a part of the spectrums, e.g., only the conjugated ±1st spectrum. That is, the spatial filter 46 blocks the 0th light beam and allows passage of only ±1st order light beams. These two light beams are applied to the second lens system 38 and the interference fringes are formed on the rear focal plane of the second lens system 38 (at the position of mirror 88c in FIG. 7). If the rear focal plane of the second lens system 38 and the surface of the reticle 18 are disposed such that they are in conjugated positional relationship to the reduction projection lens 20, this produces the equal relationship so that the image of the reticle 18 is applied directly to the projection lens.

The two light beams, which have produced interference fringes at the position of mirror 88b, are further incident to the reduction projection lens 20 so that the interference fringes are projected on the wafer 22 by the lens 20 and the fringes 48 are generated, whose pitch P₂ accords to the reduction ratio. That is, the surface of the wafer 22 and the rear focal plane of the second lens system 38 are in conjugated positional relationship.

In the apparatus of the second embodiment, the light beam for alignment 58 is deflected four times by use of the four reflection mirrors 80 and 88a~88c. In a first conversion optical system (mirror 88a), the diffracted light beam which is diffracted by the first grating 30 of reticle 18, is applied to the first lens 36 such that its light axis is substantially parallel to the reticle 18.

The light axis of the diffracted light beam which is passed through the first lens 36 is deflected by 90° near the Fourier transformation plane by the second conversion optical system (mirror 80). The spatial filter 46 is disposed near the Fourier transformation plane, and by use of the filter, only the diffracted light beam of the necessary order is passed therethrough and applied to the second lens 38. Two light beams, which are passed through the second lens 38, form the image at the focal position of the second lens 38. At this time, interference fringes are produced which have a double pitch to that of the first grating image 30 of reticle 18. At a position near the focal point, the third conversion light system (mirror 88b) is disposed and thereby, the light axis becomes parallel to reticle 18. Further, the fourth conversion optical system (mirror 88c) is disposed such that the light beam is applied to the projection lens 20. At that time, the surface of the reticle 18 and the focal plane of the second lens 38 are disposed in conjugated relationship as if the light beam applied to reticle 18 is applied directly to the projection lens 20. By use of such a structure, the alignment of the first and second gratings 30, 44 can be conducted with high precision by selective use of only two light beams selected from among the light beams diffracted by the first grating 30.

Figure 10:
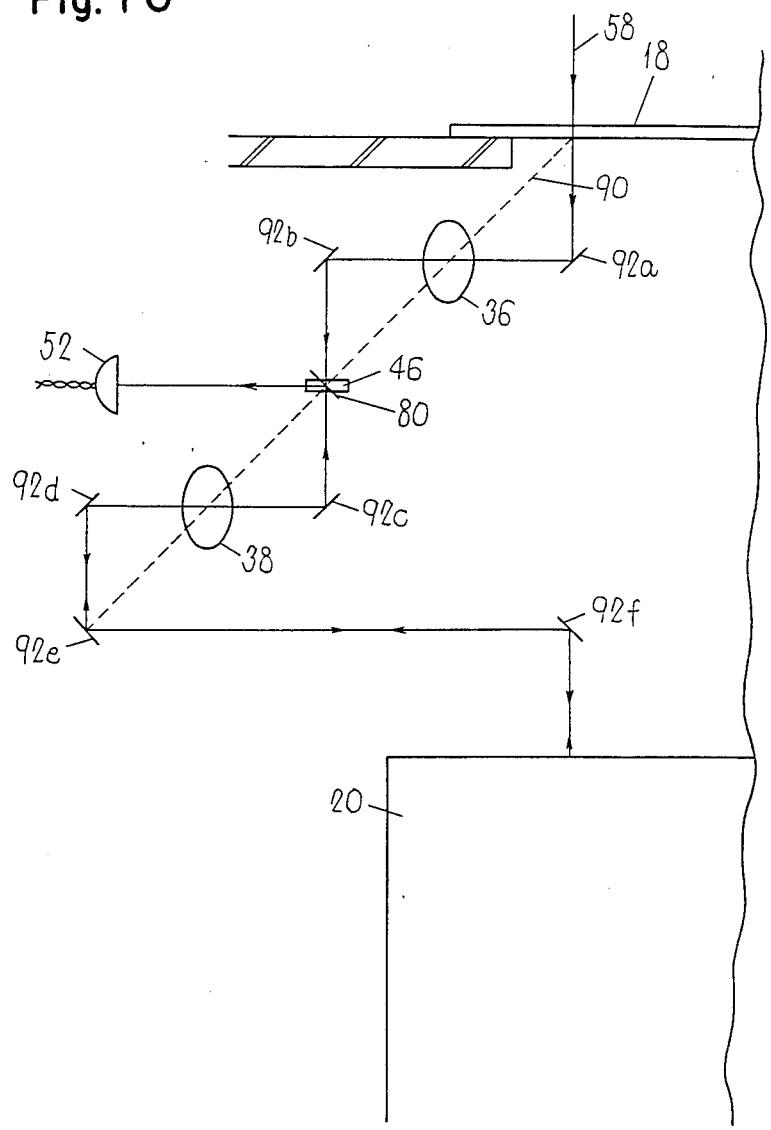
FIG. 10 shows a schematic structure of an exposure apparatus of a third embodiment.

FIG. 10 shows an exposure apparatus of a third embodiment. The structure shown in FIG. 10 differs from the FIGS. 7~9 structure on the following point. That is, in FIG. 10, the alignment optical system is disposed symmetrically to dotted line 90 which shows a conjugated relationship slanted by 45° to the reticle 18. Therefore, there are six conversion optical systems for converting the light axis. In a first conversion optical system (mirror 92a), the diffracted light beam diffracted by the first grating 30 is applied to the first lens 36 such that its light axis is substantially parallel to the reticle 18. The diffracted light which is passed through the first lens 36 has its light axis deflected 90° by a second conversion optical system (mirror 92b), and thereafter, the light axis is made substantially parallel to the reticle 18 by a third conversion optical system 92c. The Fourier transformation planes of the first and second lenses 36, 38 are disposed between the second and third conversion optical systems (mirrors 92b, 92c). The spatial filter 46 is disposed on the Fourier transformation plane. The filter 46 selects the diffracted light beams of the necessary order from among the light beams diffracted by the reticle 18, and the selected light beams are applied to the second lens 38. The light beam, which is deflected by the third conversion optical system (mirror 92c), passes through the second lens 38 and then, is oriented such that its light axis is deflected 90° by a fourth conversion optical system (mirror 92d). Then, the image of the first grating 30 is formed on the line 90. The image is of only two conjugated light beams which are passed through the spatial filter 46, and therefore, interference fringes are produced which have a double pitch to that of the first grating 30. The two light beams, which form the interference fringes, are made parallel to the surface of the reticle 18 by a fifth conversion optical system 92e and then, applied to a projection lens 20 by a sixth conversion optical system 92f. In this embodiment, the optical system is disposed symmetrically to the line 90 which shows the conjugated position. Thereby, adjustment of the optical system is readily possible, and there is enough space for the photo-detector 52.

Figure 11:
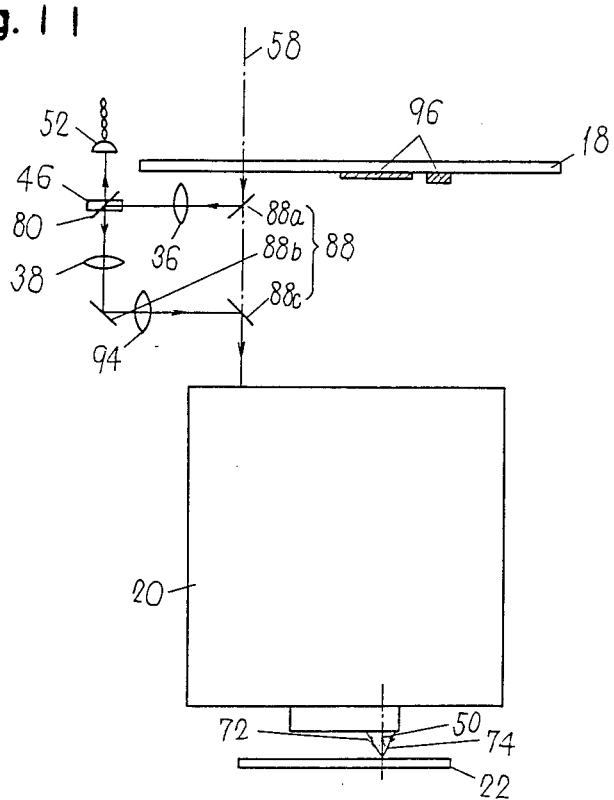
FIG. 11 shows a schematic structure of an exposure apparatus of a fourth embodiment.
Figure 12:
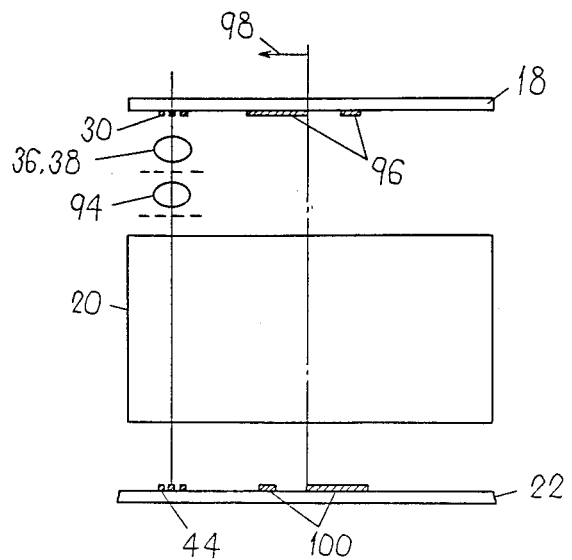
FIGS. 12, 13 and 14 are illustrations for explaining the operation of the apparatus of FIG. 11.

FIG. 11 shows an exposure apparatus of a fourth embodiment. The structure of FIG. 11 is very similar to the FIG. 7 structure, but there are some differences. That is, in FIG. 11, there is provided a third lens 94 for changing the inverted image of the first grating 30 to a normal image.

Mirrors 80, 88 (88a~88c) are used for deflecting the light axis four times so that the image of the first grating 30 made by the grating 30 and the third lens 94 is formed at an equal distance position to the projection lens 20. In this structure, the 0th order light beam is blocked by the spatial filter 46 and only the ±1st order light beams pass therethrough. The two light beams of ±1st order are applied to the second lens 38 and produce the interference fringes at the rear focal plane of the second lens 38 (at the position of mirror 88b in FIG. 11). The interference fringes are of an inverted image and therefore, move in the reverse direction with regard to the movement of reticle 18. In the case where the rear focal plane is used as an object surface of the third lens 94 and, an image surface of the third lens 94 and the reticle surface are disposed in conjugated relationship to the reduction projection lens 20, a situation is produced as if the reticle image is applied directly to projection lens 20. The two light beams, which appear on the image surface of the third lens 94, are further incident to the reduction projection lens 20. By the projection lens 20, the interference fringes are projected on the wafer 22, which fringes have a pitch corresponding to the reduction ratio.

Figure 13:
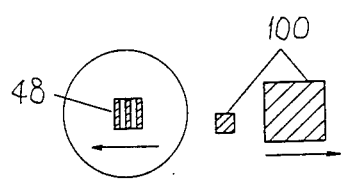
Figure 14:
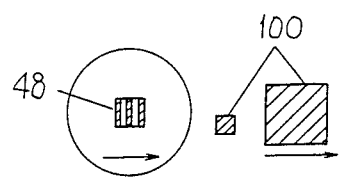

As explained above, in the FIG. 11 structure, the third lens system 94 is disposed behind a pair of Fourier transformation lenses 36, 38 which select the diffracted light beams from the first grating 30. Thereby, the image which is projected on the wafer 22 through the reduction projection lens 20 from the reticle 18 (projected image of an integrated circuit pattern 96) becomes the image of same direction which is projected on wafer 22 through a pair of Fourier transformation lenses 36, 38, the third lens 94 and the reduction projection lens 20 from the reticle 18. With such a structure, when the reticle 18 is moved relative to wafer 22 in the direction of arrow 98, as shown in FIG. 13, a reticle image 100, which is formed based upon the integrated circuit pattern 96, moves in the reverse direction without the third lens 94. On the other hand, when the third lens 94 exists, the inverted image, which is formed by a pair of Fourier transformation lenses 36, 38, is changed to the normal image by the third lens 94. Therefore, as shown in FIG. 14, the image moves in the same direction as the reticle 18. When attention is paid to the image of the wafer 22, the image moves in the reverse direction as the reduction projection lens 20 moves, and the interference fringes 48 moves in the same direction as the reticle image 100. In the case of reduction projection, the pattern 96 on the reticle 18 is 5~10 times larger than the pattern image 100 projected on the wafer 22. Therefore, the reticle 18 can be moved by a relatively smaller step than the size of the pattern 96 on the reticle 18 so that when the reticle 18 is moved, alignment with high precision can be carried out.

Figure 15:
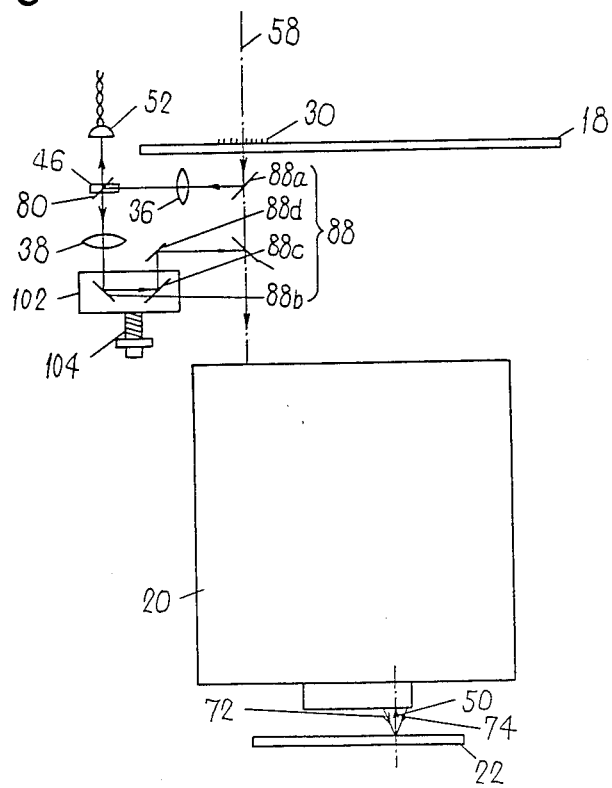
FIG. 15 shows a schematic structure of an exposure apparatus of a fifth embodiment.
Figure 16:
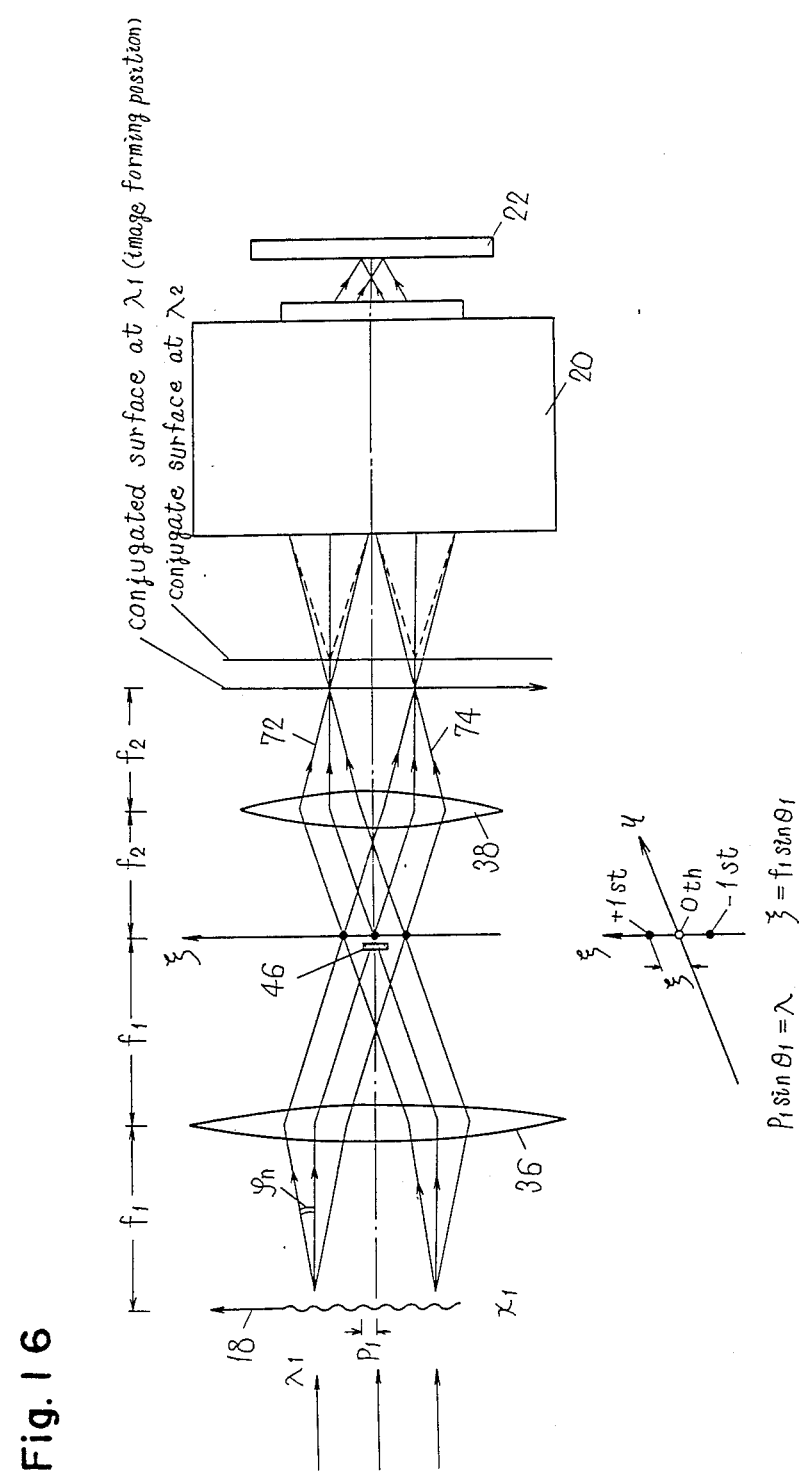
FIG. 16 is an illustration for explaining the principle of operation of the exposure apparatus of FIG. 15.

FIG. 15 shows an exposure apparatus of a fifth embodiment. Basically, the FIG. 15 structure is the same as the FIG. 7 structure, but differs on the following point. That is, in FIG. 15, there is provided a conversion optical system including mirrors 80 and 88 (88a~88e). The system is used for changing the light axis six times so that the image of the first grating 30, which is formed by the first grating 30 and the second lens 38, has a conjugated relationship corresponding to a wavelength $\lambda_1$ of the light source 26 for alignment. In the FIG. 15 structure, the rear focal plane of the second lens system 38 and the reticle surface are disposed in conjugated relationship to the reduction projection lens 20. However, the position of wafer 22 is set in accordance with the light source 10 for exposure so that it is in a conjugated relationship to the position of reticle 18. Therefore, as shown in FIG. 16, the conjugated surface at $\lambda_2$ is formed at a different position from the conjugated surface at $\lambda_1$. To conduct the alignment with high precision, the difference of wavelength is necessary to be absorbed under the situation that the wafer 22 is fixed. Unless such a structure is employed, the wafer 22 must be moved to the focal point position at wavelength $\lambda_2$ after the alignment is conducted. The position of wafer 22 is set at the position of the focal point at wavelength $\lambda_2$, and the conjugated surface of wafer 22 at wavelength $\lambda_1$ is set at the position of mirror 88b in FIG. 15.

The setting of the conjugated surface is conducted by mirror holder 102. The mirrors 88b and 88c can be moved simultaneously by the mirror holder 102. The holder 102 has an adjustment means 104, by which a deviation in the positions of the focal points of the lenses can be absorbed.

When the postions of mirrors 88b, 88c are set appropriately, the image, which is formed when the reticle 18 is illuminated by the light of wavelength $\lambda_1$, is incident directly to the projection lens 20 and, projected on the wafer 22. The two light beams, which form the interference fringes at the position of mirror 88b, are further applied to the reduction projection lens 20. Then, by the lens 20, the interference fringes are projected on the wafer 22, which fringes have a pitch corresponding to the reduction ratio of the reduction projection lens 20. Further, the relative position of the first grating 30 and the second grating 44 is detected by measuring the optical intensity of moire fringes and, by using the result of this detection, the alignment is conducted.

As stated above, the alignment of reticle 18 and wafer 22 is carried out by use of a light source 26 of wavelength $\lambda_1$ for alignment and then, the image of an integrated circuit pattern, which is formed on the reticle 18, is light exposed onto a photo-resist on the wafer 22 by the light source 10 of wavelength $\lambda_2$.

Figure 17:
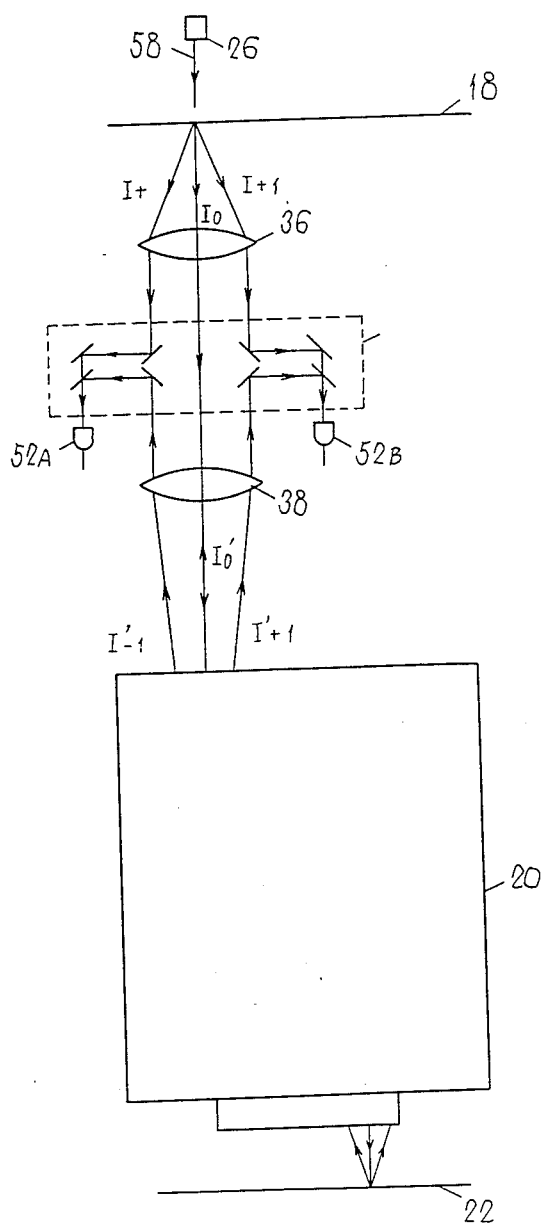
FIG. 17 shows a schematic structure of an exposure apparatus of a sixth embodiment.

FIG. 17 shows an exposure apparatus of a sixth embodiment. The FIG. 17 structure enables the adjustment of non-symmetry of an alignment mark. In the previous embodiments, ±1st diffracted light beams pass through the first and second lenses 36, 38 and the spatial filter 46. However, in the FIG. 17 structure, only the 0th order light beam $I_o$ is projected on the wafer 22. The projected light beam is diffracted by the second grating 44 and then, the diffracted light beam passes in the reverse direction through the reduction projection lens 20 and the second lens 38, and is applied to the spatial filter 46. In the spatial filter 46, diffracted light beams of $I_{+1}$ and $I_{-1}$ from reticle 18 are superimposed with re-diffracted light beams of $I'_{+1}$ and $I'_{-1}$ from the wafer 22. Then, phase as position information of reticle 18 is compared with position information of wafer 22 by use of photodetectors 52A and 52B.

Figure 18:
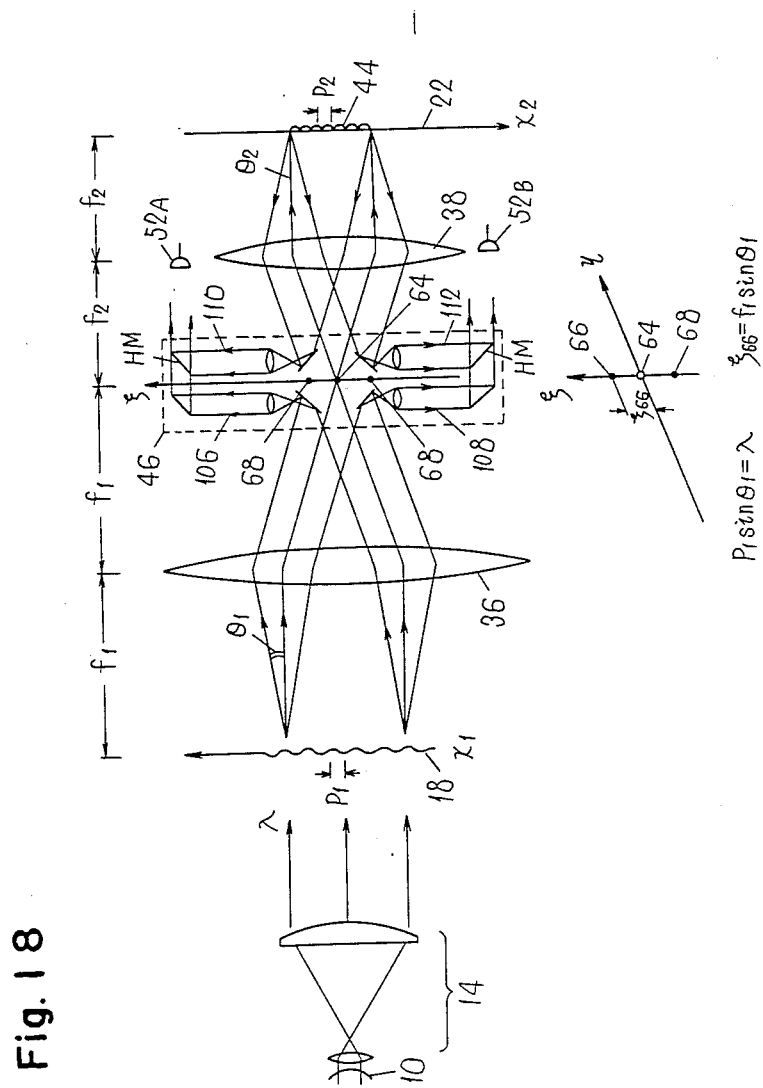
FIGS. 18, 19 and 20 are illustrations for explaining the operation of the apparatus of FIG. 17.

As stated above, only the 0th order light beam $I_o$ is passed through the spatial filter 46 in the FIG. 17 structure. The ±1st order light beams are supplied near the Fourier transformation plane in the directions of light beams 106, 108 as shown in FIG. 18. The 0th order light beam passes through the reduction projection lens 20 (not shown in FIG. 18) after being passed through the second lens 38, and is projected on the wafer 22. The image, which is projected on the wafer 22 is substantially of the image of the window portion of the reticle 18. The diffracted light beams are reflected by the second grating 44 of the wafer 22.

Supposing that the relationship between the pitch $P_2$ of the second grating 44 of the wafer 22 and the pitch $P_1$ of the first grating 30 of the reticle 18 is as follows, $$P_1 = \frac{\lambda}{\sin\theta_1} = m\frac{f_1}{f_2} \cdot \frac{\lambda}{\sin\theta_2} = m\frac{f_1}{f_2} \cdot P_2 \quad (11)$$

Wherein, $\theta_1$, $\theta_2$ are diffraction angles shown in FIG. 18, $\lambda$ is the wavelength of the light source and there is a relation of $\xi_{66}=f_1 \sin\theta_1 = f_2 \sin2\theta_2$ since the first and second lenses 36, 38 are optically coupled on the Fourier transformation plane, and m is the reduction ratio of the reduction projection lens 20, the diffracted light beams from the second grating 44 of the wafer 22 are moving in the direction to form the Fourier spectrums at positions 64, 66 and 68.

When the positions of the diffracted light beams 110, 112 which are reflected by the wafer 22 are compared with the light beams 106, 108 diffracted by reticle 18 by use of half mirrors HM, position information relating to positions of reticle 18—co-ordinates 66 and co-ordinates 66 for grating 44 of wafer 22 and position information relating to positions of reticle 18—co-ordinates 68 and co-ordinates 68 for grating 44 of wafer 22 are represented by the difference of optical intensity. The position information of the grating 44 of the wafer 22 includes information relating to position perpendicular to light axis. When the wafer 22 is moved in the direction perpendicular to light axis, the intensity of the light beams which are passed through the half mirrors HM changes in a cosine manner. Based upon such a cosine manner of change of the light intensity, the position of grating 44 can be identified.

Figure 19:
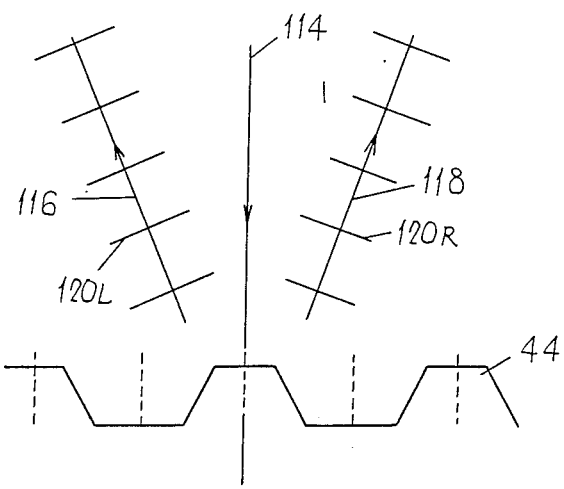
Figure 20:
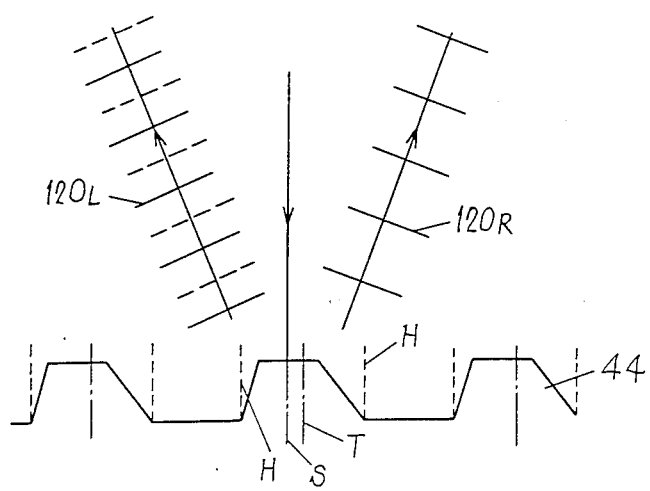

FIGS. 19 and 20 show the technique for alignment when the shape of the gratings is not symmetrical. Incident light 114 is applied perpendicularly to the grating 44 and light beams 116, 118 are diffracted by grating 44 in a symmetrical manner. In the case where the shape of the grating 44 is a symmetrical one as shown in FIG. 19, wave surfaces 120L, 120R showing the phase of the diffracted light beams are symmetrical. On the other hand, in the case where the shape of the grating 44 is not symmetrical, there is produced a deviation of the phase corresponding to non-symmetry of the grating shape so that the wave surfaces 120L, 120R are deviated as compared with the case in FIG. 19.

The diffracted light beams having the information of non-symmetry are compared with the phase of the diffracted light beams from the reticle 18 by use of the FIG. 1 structure. Thereby, the alignment, taking the non-symmetry into consideration, can be carried out.

In the case where the grooves of the grating are symmetrical, the center of the interference fringes is aligned with the center of the groove as shown in FIG. 19. In the case where the grooves are not symmetrical, the aligned position becomes position S which is away from a center T of a position H of a setting which produce a large alignment error. However, when the adjustment is conducted based upon the grating shape presumed from the measurement of the intensity of the diffracted light beams, precise alignment can be conducted. Further, the moving distance for such adjustment can be detected as the amount of change in the light intensity and therefore can be monitored. Thus, the movement of the stage can be detected precisely.

As to input of adjustment data, when the grooves of the grating are not symmetrical and the alignment of the interference fringes and the grating is conducted by detecting the diffracted light beams ($\pm$ 1st order) perpendicular to wafer 22, the alignment is completed at the position S. In this case, the difference between position S and the center T (center of a bottom portion of the groove H—H) is read out based upon the grating shape previously presumed and then the adjustment data is inputted. The level of the adjustment data is determined by comparing data presumed from the difference of T and S with data accumulated in the actual alignment processes. Based upon the adjustment data, the wafer 22 is moved to enable alignment with high precision.

An exposure apparatus of a seventh embodiment is now explained. The apparatus is similar to the FIG. 1 structure except that both the 0th order and 1st order light beams, in addition to $\pm$1st order light beams, are passed through the spatial filter 46 and the light intensity of moire fringes due to the 0th order, 1st order diffracted light beams from the second grating 44 is compared with the light intensity of moire fringes due to the $\pm$1st order light beams, thereby enabling the alignment with high precision. In this embodiment, the $\pm$1st order light beams pass through a first spatial filter and 0th order, 1st order light beams pass through a second spatial filter. The differences between an alignment position due to $\pm$1st order light beams and an alignment position due to 0th order, 1st order light beams is read out and based upon the read out data, the alignment is conducted according to the shape of the surface.

Figure 21:
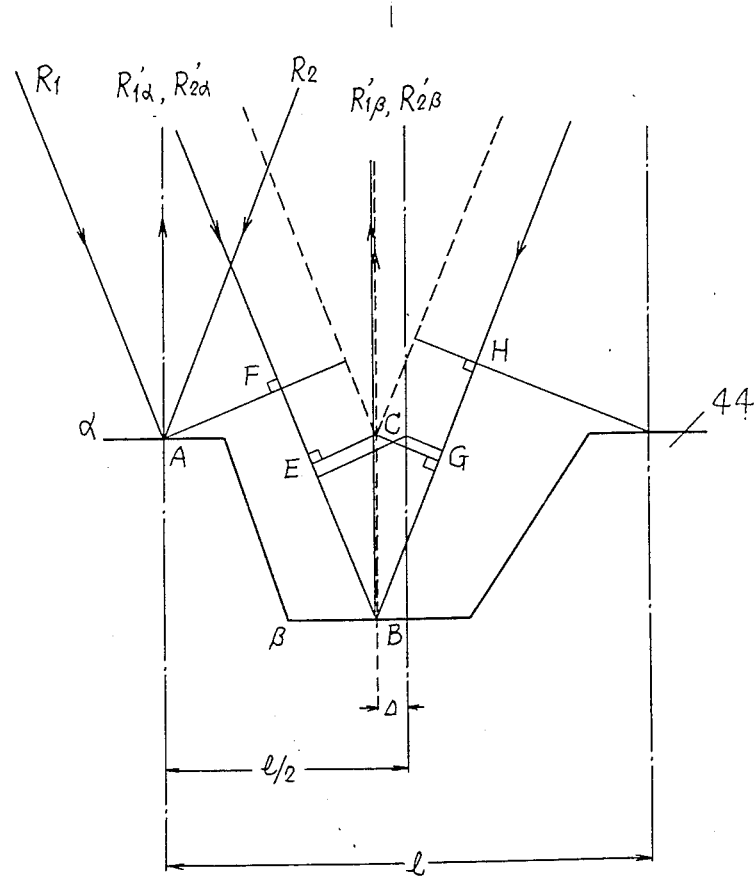
FIGS. 21 and 22 show a schematic structure of a part of an exposure apparatus of a seventh embodiment.
Figure 22:
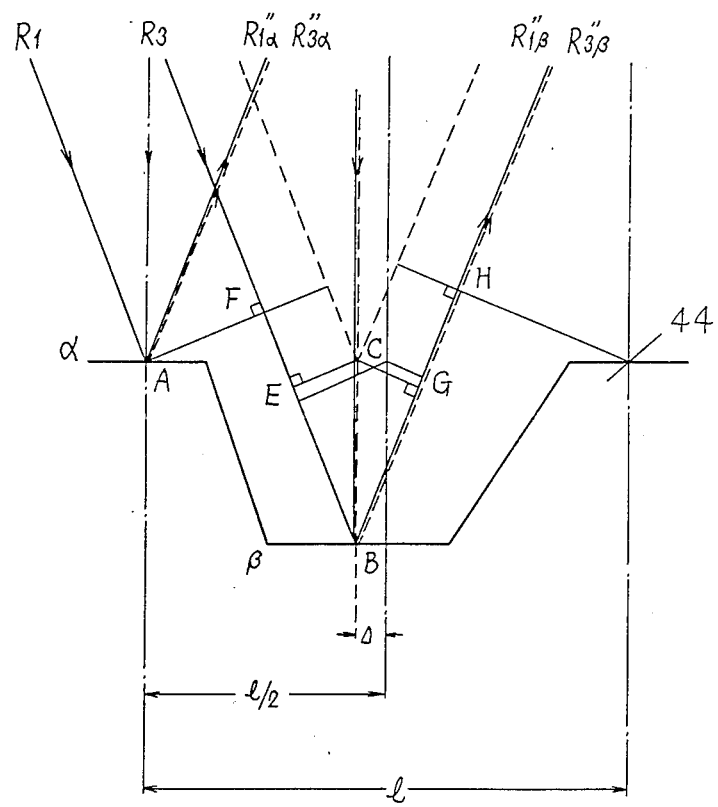

FIG. 21 shows the situation wherein the $\pm$1st order light beams, which are diffracted by reticle 18, are incident to a non-symmetrical grating 44 of cycle l. FIG. 22 shows the situation wherein the 0th order and $\pm$1st order light beams, which are diffracted by reticle 18, are incident to a non-symmetrical grating 44. $\alpha\beta$ designate the top surface and bottom surface of the grating respectively. $\beta$ is located away from the position of 1/2 by the deviation $\Delta$. The depth of the grooves of the 44 is represented by d.

In FIG. 21, the phase difference of the light beams diffracted at point A of surface $\alpha$ and the light beams diffracted at point B of surface $\beta$ is calculated as follows. With regard to $\pm$1st order light beam $R_1$ coming from the left side of the figure, the phase difference of diffracted light beams $R'_{1\alpha}$ and $R'_{1\beta}$ corresponds to a distance FEBC.

$$\text{Distance } FEBC = \left(\frac{l}{2} - \Delta\right)\sin\phi + d(1 + \cos\phi) \quad (12)$$

With regard to the $-$1st order light beam $R_2$, the phase difference of diffracted light beams $R'_{2\alpha}$ and $R'_{2\beta}$ corresponds to distance HGBC.

$$\text{Distance } HGBC \left(\frac{l}{2} - \Delta\right)\sin\phi + d(1 + \cos\phi) \quad (13)$$

In the case where the light beams $R_1$ and $R_2$ are incident simultaneously, the diffracted light beams $R'_{1\alpha}$, $R'_{1\beta}$ and $R'_{2\alpha}$, $R'_{2\beta}$ are simultaneously observed as moire beams, and the intensity of the moire beams changes in the deviated manner by only 2 sinφ; phase difference of (12)~13).

On the other hand, in the case where ±1st order light beam R₁ and 0th order light beam R₃ are incident to the wafer 22 as shown in FIG. 22, the phase difference of the diffracted light beams from grating 44 is calculated as follows.

With regard to the ±1st order light beam R₁ coming from the figure's left side, the phase difference of diffracted light beams $R''_{1\alpha}$ and $R''_{1\beta}$ corresponds to distance FEGH.

$$\text{Distance } FEGH \left( \frac{l}{2} - 2\Delta \right) \sin\phi + 2d\cos\phi \tag{14}$$

With regard to the 0th order light beam R₃, the phase difference of diffracted light beams $R''_{3\alpha}$ and $R''_{3\beta}$ corresponds to distance CBGH.

$$\text{Distance } CBGH = \left( \frac{l}{2} - \Delta \right) \sin\phi + d(1 + \cos\phi) \tag{15}$$

In the case where the light beams R₁ and R₃ are incident simultaneously, the diffracted light beams $R''_{1\alpha}$, $R''_{1\alpha}$, $R''_{1\beta}$ and $R''_{3\alpha}$, $R''_{3\beta}$ are simultaneously observed as moire beams, and the intensity of the moire beams changes in the deviated manner by only $-\Delta\sin\phi - d(1-\cos\phi)$; phase difference of (14)~(15).

The unknown number in 2 sin0 calculated in FIG. 21 and $-\Delta\sin\phi d(1-\cos\phi)$ calculated in FIG. 22 is only Δ since the incident angle φ and the grating depth d are known.

Figure 23:
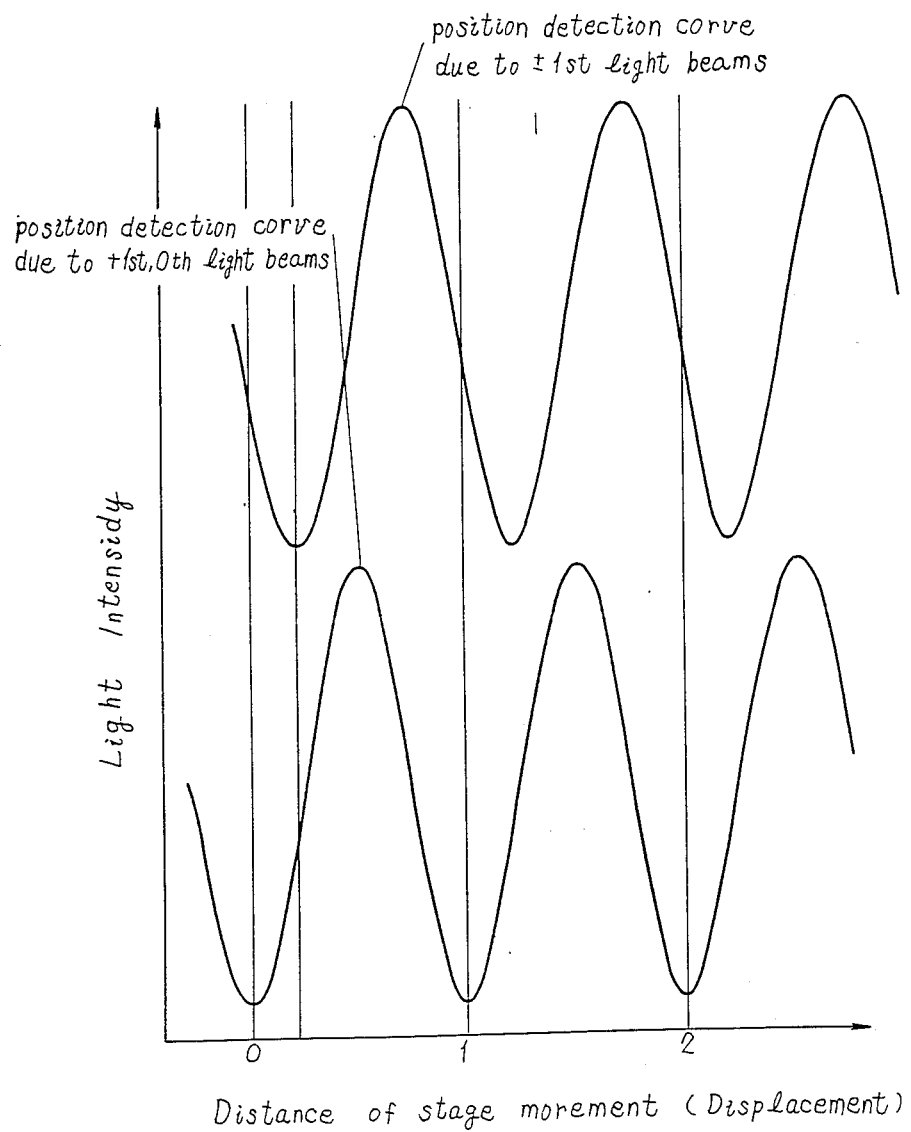
FIGS. 23, 24 and 25 show graphs of light intensity vs. displacement.

Further, as shown in FIG. 23, the unknown number is determined by measuring and comparing the light intensity according to the distance of the stage movement.

Figure 24:
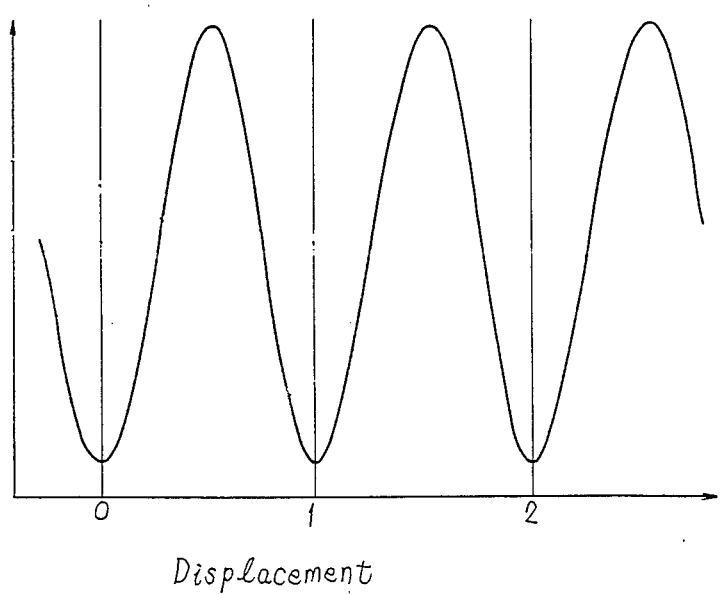
Figure 25:
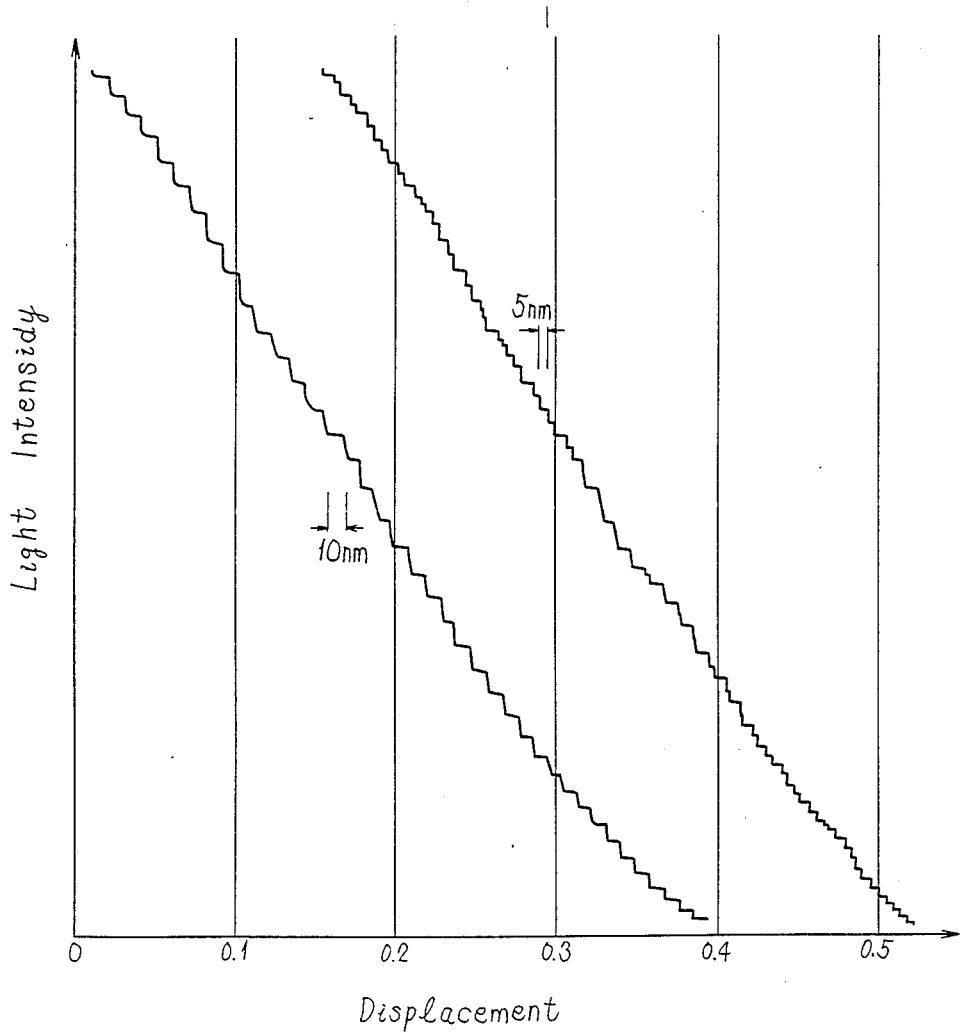

FIGS. 24 and 25 show characteristic graphs of light intensity upon the alignment. In the embodiments, a laser interference meter is constructed by a lens systems of the exposure apparatus with the use of the light beams diffracted by the first and second gratings 30 and 44. As shown in FIGS. 24 and 25, the grating 44 of the wafer 22 is moved in steps of 5 nm by a stepping motor and a light intensity is obtained according to each such step.

This means that the sensitivity of the position detection method is 5 nm. The same sensitivity of position detection can be obtained as to a wafer on which aluminum is deposited with rough surface.

Figure 27:
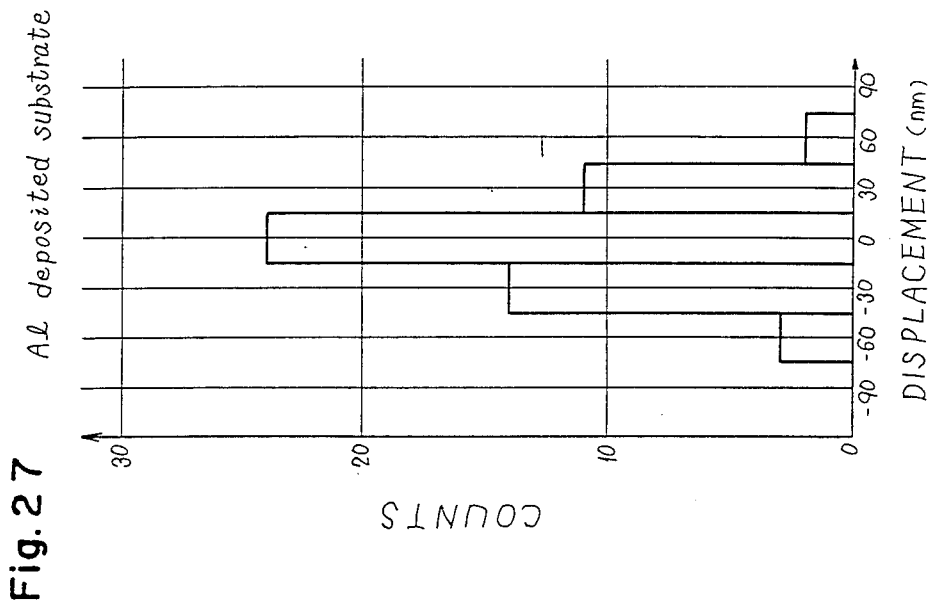
FIGS. 26 and 27 show graphs of counts vs. displacement.
Figure 26:
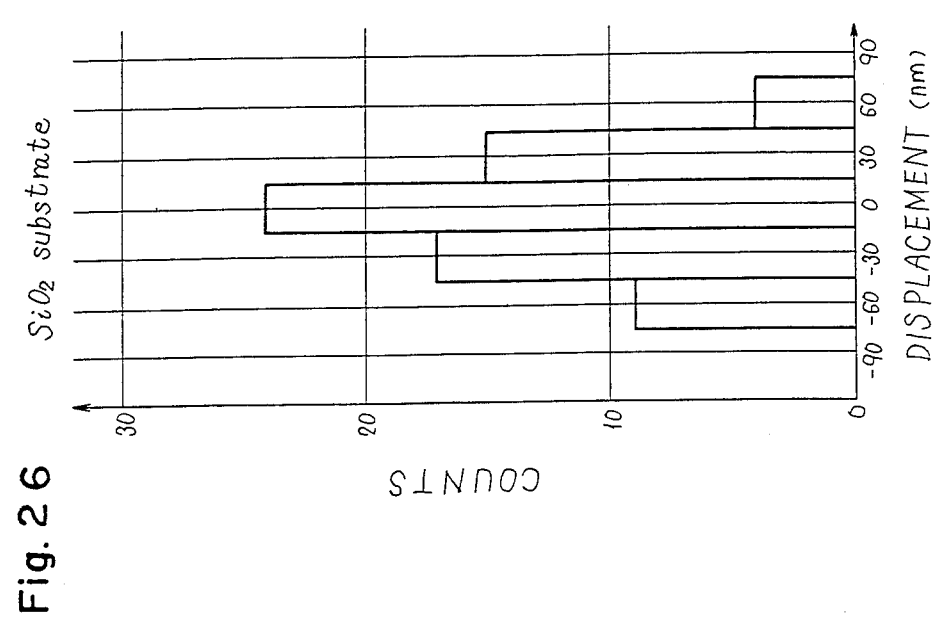

FIGS. 26 and 27 are histograms showing precision of alignment. Alignment precision is approximately 0.2 μm according to a conventional method, but it is less than 0.1 μm /3σ according to this invention. Further, as to the Al deposited substrate with a rough surface, the alignment of less than 0.1 μm /3σ precision is realized.

Figure 28:
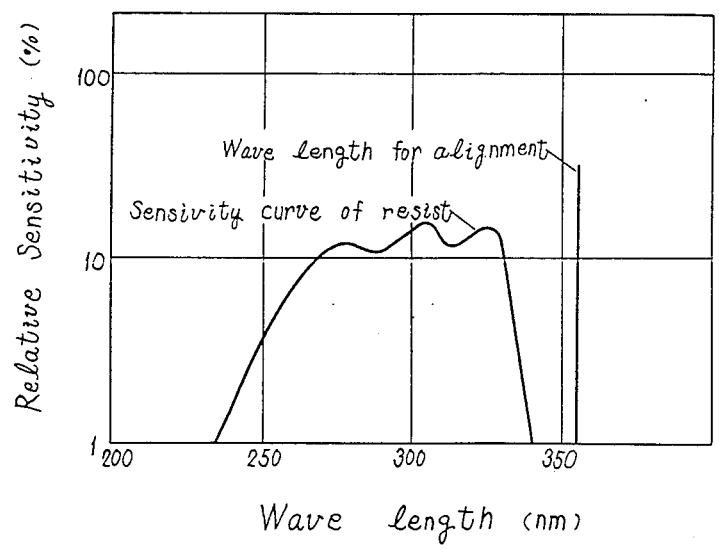
FIG. 28 shows a graph of relative sensitivity vs. wavelength.

In addition, according to the invention, it is possible to change the wavelength for exposure from that for alignment. Therefore, as shown in FIG. 28, it is possible to select the wavelength for alignment in the range of wavelengths outside the sensitivity range of the resist so that the alignment mark can be protected.

While specific embodiments of the invention have been illustrated and described herein, it is realized that modifications and changes will occur to those skilled in the art. It is therefore to be understood that the appended claims are intended to cover all modifications and changes as fall within the true spirit and scope of the invention.

What we claim is:

1. An exposure apparatus comprising:
   a light source;
   a reticle having a first grating;
   first lens system;
   second lens system;
   a spatial filter disposed between the first and second lens systems;
   a reduction projection lens;
   a wafer having a second grating; and
   a photo-detector;
   wherein, the light beam generated from the light source is applied to the reticle at which it is divided into a plurality of diffracted light beams by the first grating, and the diffracted light beams are applied through the first lens system to the spatial filter so that only selected diffracted light beams pass through the spatial filter, and the selected diffracted light beams are applied through the second lens system and the reduction projection lens to the wafer so that the selected diffracted light beams are incident to and re-diffracted by the second grating, and the re-diffracted light beams are diffracted in the same direction according to an angle between the incident light beams and the second grating and pitch of the second grating so that conjugate incident light beams are interfered with each other, and light intensity of the interfered light beams is detected by the photo-detector, and alignment of the reticle and the wafer is conducted based upon the output of the photo-detector.

2. The exposure apparatus of claim 1, wherein said light source comprises a first light source (wavelength λ₁) which is used only for alignment and a second light source (wavelength λ₂) which is provided for exposure purposes, the positons of said reticle, reduction projection lens and wafer determined by the light beam λ₂, and the position of said reticle, the first and second lens system, said reduction projection lens and wafer determined by the light beam λ₁, so as to set the image plane of said second lens system to be conjugate of the reticle and the wafer plane.

3. The exposure apparatus of claim 1, further comprising a third lens system for converting reversed interference fringes to a normal image.

4. An exposure apparatus comprising:
   a light source for exposure purposes;
   a reticle having a first grating at a peripheral portion of the reticle;
   a wafer having a second grating at a peripheral portion of the wafer;
   a light source for alignment purposes;
   conversion optical system for converting light axis at least four times;
   first lens system;
   second lens system;
   a spatial filter disposed between the first and second lens systems; and
   a photo-detector;
   wherein a circuit pattern of the reticle is applied as image on the wafer by the illumination of the light exposure for exposure purpses, and the light beam generated from the light source for alignment purposes is applied to the reticle at which it is divided into a plurality of diffracted light beams are applied through the first lens system to the spatial filter so that only selected diffracted light beams pass through the spatial filter, and the selected diffracted light beams are applied through the second lens system and reduction projection lens to the wafer so that the selected diffracted light beams are incident to and re-diffracted by the second grating, and the re-diffracted light beams are diffracted in the same direction according to an angle between the incident light beams and the second grating and pitch of the second grating so that conjugate incident light beams are interfered with each other, and light intensity of the interfered light beams is detected by the photo-detector, and alignment of the reticle and the wafer is conducted based upon the output of the photo-detector.

5. The exposure apparatus of claim 4, wherein the light beams diffracted from said first grating on the reticle are applied to the first lens system and one beam selected by a spatial filter is further applied through the second lens system and reduction projection lens to the wafer so that the selected light beam is re-diffracted as re-diffracted light beams by the second grating, and the re-diffracted light beams go back through the reduction projection lens and the second lens system, and the re-diffracted beams are interfered with the beams diffracted from the first grating, and light intensities of the interfered light beams are detected and compared in order to align the reticle and the wafer.

6. The exposure apparatus of claim 4, wherein first and second sets of light beams diffracted from said first grating on the reticle are selected by the spatial filter successively, and the first set of light beams is projected on the second grating of the wafer, the light beams of the first set are re-diffracted by the second grating, and the re-diffracted light beams of the first set are diffracted in the same direction according to an an angle between the incident light beams and the second grating so that conjugate incident light beams are interfered with each other, and a first output is detected by the photo-detector, in the same manner the second set of light beams is projected on the second grating and a second output is detected, and the alignment of the reticle and the wafer is conducted based upon the comparison between the first and second outputs.

* * * * *